(12) United States Patent
Fournel et al.

(10) Patent No.: US 11,551,976 B2
(45) Date of Patent: Jan. 10, 2023

(54) THIN-FILM TRANSFER METHOD

(71) Applicant: COMMISSARIAT A L'ENERGIE ATOMIQUE ET AUX ENERGIES ALTERNATIVES, Paris (FR)

(72) Inventors: Frank Fournel, Grenoble (FR); Laurent Michaud, Grenoble (FR); Pierre Montmeat, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 73 days.

(21) Appl. No.: 17/284,226

(22) PCT Filed: Oct. 10, 2019

(86) PCT No.: PCT/EP2019/077513
§ 371 (c)(1),
(2) Date: Apr. 9, 2021

(87) PCT Pub. No.: WO2020/074658
PCT Pub. Date: Apr. 16, 2020

(65) Prior Publication Data
US 2021/0343595 A1 Nov. 4, 2021

(30) Foreign Application Priority Data
Oct. 12, 2018 (FR) .................................. 18 59456

(51) Int. Cl.
*H01L 21/78* (2006.01)
(52) U.S. Cl.
CPC .............................. *H01L 21/7806* (2013.01)

(58) Field of Classification Search
CPC ....................... H01L 21/2007; H01L 21/7806
See application file for complete search history.

(56) References Cited

U.S. PATENT DOCUMENTS

| 2014/0295642 A1 | 10/2014 | Fournel et al. |
| 2016/0307924 A1 | 10/2016 | Forrest et al. |
| 2019/0311895 A1 | 10/2019 | Montmeat et al. |

FOREIGN PATENT DOCUMENTS

| KR | 2016002814 A | * | 1/2016 | ....... H01L 21/02164 |
| WO | WO 2013/050683 A1 | | 4/2013 | |

(Continued)

OTHER PUBLICATIONS

International Search Report dated Jan. 15, 2020 in PCT/EP2019/077513 filed on Oct. 10, 2019, 2 pages.

(Continued)

*Primary Examiner* — Dale E Page
*Assistant Examiner* — Molly K Reida
(74) *Attorney, Agent, or Firm* — Oblon, McClelland, Maier & Neustadt, L.L.P.

(57) ABSTRACT

A method includes transferring a layer onto a flexible substrate, the layer being located in a stack on the front face of the substrate. The substrate includes at least one supplementary stack interposed between the stack and the bulk layer of the substrate. This supplementary stack includes at least two layers with thicknesses decreasing in the direction of the front face. The method makes provision, after bonding the flexible substrate on the front face, for successively and gradually removing the various layers of the substrate. Such gradualness makes it possible to transfer a thin layer of silicon, with a thickness of less than 50 nm, onto a flexible substrate.

12 Claims, 5 Drawing Sheets

(56) References Cited

FOREIGN PATENT DOCUMENTS

| WO | WO 2013/050683 A9 | 4/2013 |
| WO | WO 2015/084868 A1 | 6/2015 |
| WO | WO 2018/104513 A1 | 6/2018 |

OTHER PUBLICATIONS

Montmeat et al., "Transfer of ultra-thin semi-conductor films onto flexible substrates", ECS Transactions, 2016, vol. 75, No. 9, pp. 247-252.

* cited by examiner

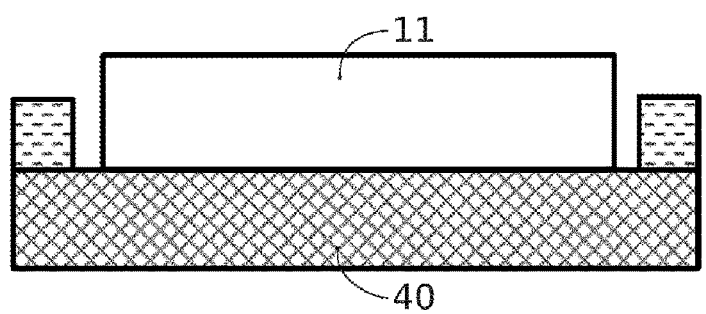
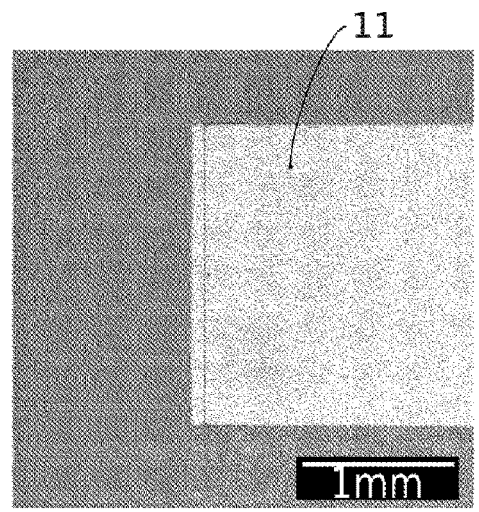
Fig. 1A
Prior Art
Fig. 1B
Prior Art
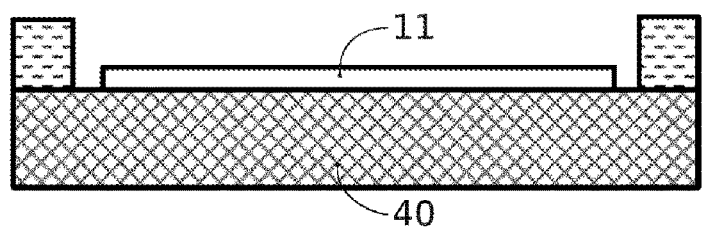
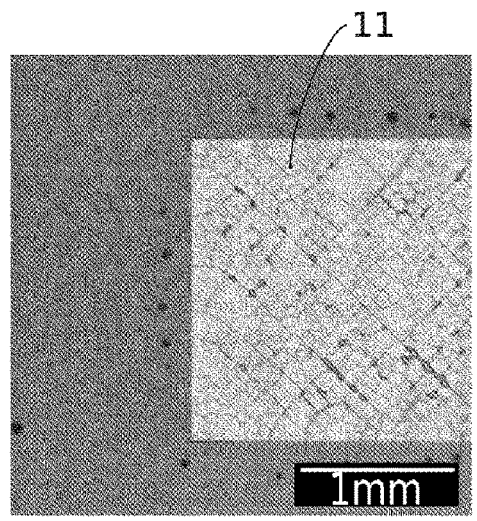
Fig. 2A
Prior Art
Fig. 2B
Prior Art

THIN-FILM TRANSFER METHOD

TECHNICAL FIELD

The invention relates to the field of microtechnologies and microelectronics. It finds a particularly advantageous application in the transfer of a semiconductor thin film onto a flexible substrate.

PRIOR ART

In the microelectronics field, one means for generating a mechanical force in a thin layer of a semiconductor material is transferring this thin layer onto a flexible substrate, and then deforming the flexible substrate.

By deforming the flexible substrate in a main extension plane of the thin layer, it is thus possible to apply a biaxial tensile stress state to the thin layer, for example.

The thin layer may come from a substrate of the "silicon on insulator" (SOI) type. It may correspond in particular to the top silicon layer, referred to as top Si, of this SOI substrate.

Transferring the thin layer onto the flexible substrate is a critical phase.

The document "Transfer of Ultra-Thin Semi-Conductor Films onto flexible substrates, Montméat et al., 2017" discloses a method for transferring a thin layer onto a flexible substrate, comprising a first bonding on the front face of the SOI on a carrier substrate, a trimming and etchings on the rear face of the SOI in order to expose the top Si, and a second bonding of the top Si exposed on the flexible substrate. After removal of the carrier substrate, a thin layer of Si on a flexible substrate is thus obtained.

As illustrated in FIGS. 1A and 1B, such a method makes it possible to transfer a 200 nm thick monocrystalline top Si 11 onto a flexible substrate 40 without causing any cracks (FIG. 1B).

For an increasing number of applications, it would however be preferable to transfer a thin layer of Si having a thickness of less than 200 nm.

For example, the work of the applicant shows that the method mentioned above does not make it possible to transfer a monocrystalline top Si 20 nm thick onto a flexible substrate in a satisfactory manner (FIG. 2A). For such a thickness, cracks appear after transfer, as illustrated in FIG. 2B.

In particular, this method uses the intermediate silicon oxide layer of the SOI substrate, referred to as BOX (the English acronym "Buried OXide"), as a stop layer for the rear-face etching.

This stop layer must be sufficiently thick to avoid etching the top Si, and sufficiently thin to avoid the appearance of cracks.

Such a stop layer is however incompatible with the method described above.

One object of the present invention is to at least partly overcome these drawbacks.

A method for transferring thin layers using a stack with an interface layer made from polymer material is moreover known from the patent publication WO 2018/104513 A1. Moreover, a method for transferring layers using a donor substrate and a receiver substrate, via an intermediate substrate, with specific bonding steps, is known from the patent publication WO 2013/050683 A1.

In particular, one object of the present invention is to propose a method for transferring a layer, making it possible to transfer a thin layer of a semiconductor material onto a flexible substrate without causing cracks in the thin layer, in particular for a thickness of thin layer of less than 200 nm.

SUMMARY

To achieve this objective, it Is provided a layer-transfer method comprising the following steps:
  providing a first substrate having a front face and a rear face and comprising a support forming the rear face and a stack on the support, said stack comprising a first layer made from a first, semiconductor, material, forming the front face, and a second layer made from a second, dielectric, material,
  providing a second substrate having a free face and comprising a layer made from a polymer material forming the free face,
  bonding the first and second substrates at an interface between the front face of the first substrate and the free face of the second substrate, removing the support and then the second layer from the first substrate, so as to expose the first layer bonded on the layer made from a polymer material.

Advantageously, the first substrate is formed with at least one supplementary stack comprising a third layer made from a third material and a fourth layer made from a fourth material, said at least one supplementary stack being interposed between the support and the stack of the first substrate, so that the fourth layer is on the same side as the support and the third layer is on the same side as the second layer of the stack.

The method further comprises at least one additional step configured to remove the fourth layer and then the third layer, and then preferably the second layer.

Preferably, the fourth layer is removed by an etching having a selectivity with respect to the third material greater than 5, then the third layer is removed by an etching having a selectivity with respect to the second material greater than 5, then the second layer is removed by an etching having a selectivity with respect to the first material greater than 5.

Use of such a supplementary stack makes it possible to more gradually and more finely control the way in which the various layers are removed.

In particular, this supplementary stack constitutes a buffer zone or a zone of transition towards the stop layer.

This supplementary stack can be seen as a multilayer stop stack.

It makes it possible to protect the first layer, referred to as the top layer.

It also makes it possible to relax some of the mechanical stresses of the top layer.

The various layers of this supplementary stack can in fact partly absorb or store the mechanical stresses of the top layer.

When these various layers are removed, the relaxation of the stresses, mainly at the free surfaces, is done gradually, which ultimately avoids the occurrence of cracks in the top layer.

This supplementary stack, comprising at least two layers of different natures, also affords better control of the removal of these various layers.

The method proposed by the present invention thus makes it possible to avoid an excessively rapid removal or etching of the second layer, referred to as the stop layer.

This supplementary stack makes the method proposed by the present invention compatible with a thin stop layer, typically a stop layer having a thickness of around 40 nm or 50 nm.

The method according to the invention consequently makes it possible, for example for a stop layer of approximately 40 nm, to transfer a top layer of approximately 20 nm or less onto a layer made from a polymer material of a flexible substrate without causing cracks in said top layer.

BRIEF DESCRIPTION OF THE FIGURES

The aims, objects, features and advantages of the invention will emerge more clearly from the detailed description of embodiments thereof that are illustrated by the following accompanying drawings, wherein:

FIG. 1A shows schematically in cross section a top layer approximately 200 nm thick on a flexible substrate obtained by a transfer method according to the prior art;

FIG. 1B shows in plan view a top layer made from Si approximately 200 nm thick on a flexible substrate obtained by the transfer method according to the prior art illustrated in FIG. 1A;

FIG. 2A shows schematically in cross section a top layer approximately 20 nm thick on a flexible substrate obtained by a transfer method according to the prior art;

FIG. 2B shows in plan view a top layer made from Si approximately 20 nm thick on a flexible substrate obtained by the transfer method according to the prior art illustrated in FIG. 2A;

Figures 3A, 3B:
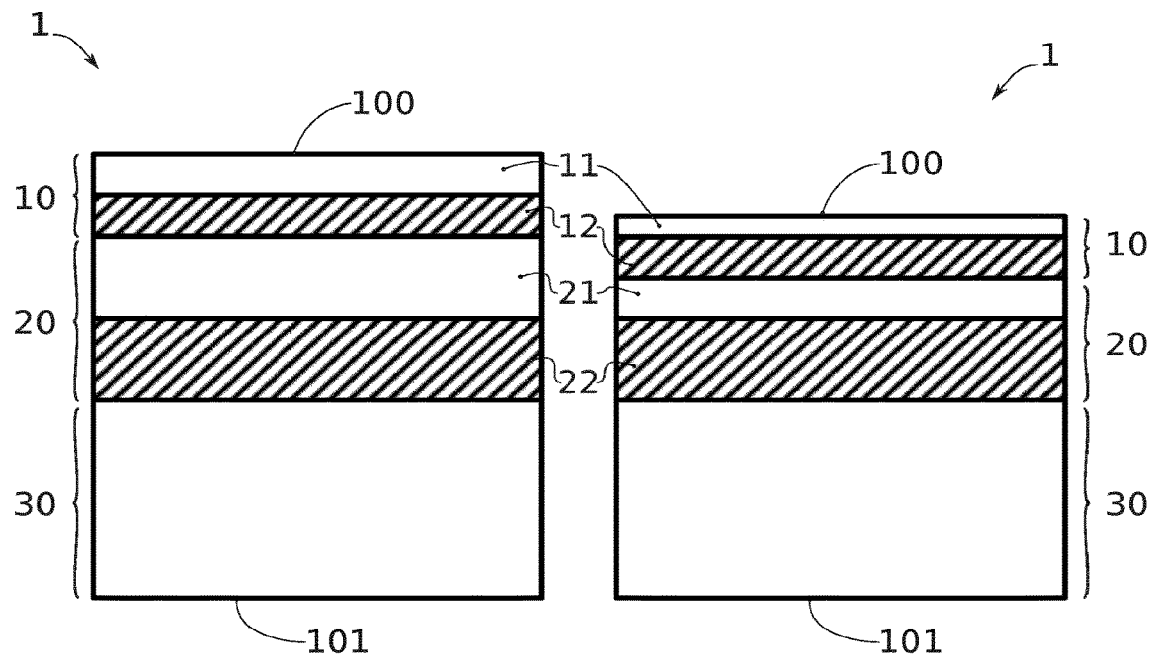
FIG. 3A illustrates in cross section a substrate comprising a supplementary stack according to one embodiment of the invention.
FIG. 3B illustrates in cross section a substrate comprising a supplementary stack according to another embodiment of the invention.

The drawings are given by way of examples and are not limitative of the invention. They constitute schematic outline representations intended to facilitate understanding of the invention and are not necessarily to the scale of practical applications. In particular, the thicknesses relating to the various layers and wafers are not representative of reality.

DETAILED DESCRIPTION

Before beginning a detailed review of embodiments of the invention, optional features, which may optionally be used in association or alternatively, are stated below:

According to one embodiment, the method further comprises a second transfer step after the second layer of the first substrate is removed, this second step comprising the provision of a flexible substrate and the bonding of this flexible substrate to an exposed face of the first layer, opposite to the front face, and then a separation, for example by mechanical pulling away, of the first layer and of the layer made from a polymer material so as to expose the front face of the first layer bonded on the flexible substrate.

According to one embodiment, the thickness of the first layer is selected so as to be strictly less than the thickness of the third layer.

According to one embodiment, the thickness of the second layer is selected so as to be strictly less than the thickness of the fourth layer.

According to one embodiment, the thickness of the first layer is selected so as to be at least two times less than the thickness of the third layer.

According to one embodiment, the thickness of the second layer is selected so as to be at least two times less than the thickness of the fourth layer.

According to one embodiment, the thickness of the first layer is selected so as to be strictly less than the thickness of the second layer.

According to one embodiment, the thickness of the third layer is selected so as to be strictly less than the thickness of the fourth layer.

According to one embodiment, the thickness of the first layer is selected so as to be at least two times less than the thickness of the second layer.

According to one embodiment, the thickness of the third layer is selected so as to be at least two times less than the thickness of the fourth layer.

According to one embodiment, the support is partially removed by trimming over at least 90%, and preferably over at least 95%, of the thickness thereof.

According to one embodiment, the support is partially removed by trimming, said trimming being configured so as to leave a residual layer of the support having a residual thickness of less than or equal to 50 μm.

According to one embodiment, the residual layer is removed by a first etching having a selectivity with respect to the fourth material greater than 5.

According to one embodiment, the fourth layer is removed by a second etching having a selectivity with respect to the third material greater than 5.

According to one embodiment, the third layer is removed by a third etching having a selectivity with respect to the second material greater than 5.

According to one embodiment, the second layer is removed by a fourth etching having a selectivity with regard to the first material greater than 5.

According to one embodiment, the first etching and the third etching are etchings in solution having the same composition, preferably based on a mixture of acetic acid/70% nitric acid $HNO_3$/hydrofluoric acid HF, preferably based on a mixture of acetic acid/70% concentrated $HNO_3$/49% concentrated HF in a 3/3/4 proportion.

According to one embodiment, the second etching and the fourth etching are etchings in solution having the same composition, preferably based on hydrofluoric acid HF, for example based on 10% dilute HF.

According to one embodiment, the thickness of the second layer is less than or equal to 100 nm, preferably less than or equal to 50 nm.

According to one embodiment, the thickness of the first layer is less than 100 nm, preferably less than or equal to 50 nm.

According to one embodiment, the polymer material is a thermoplastic material.

According to one embodiment, the first and third materials are at least one from silicon, germanium and a silicon-germanium alloy.

According to one embodiment, the second and fourth materials are at least one from a silicon oxide and a silicon nitride.

According to one embodiment, the support is made from silicon and the first and third materials are solely silicon.

According to one embodiment, the second and fourth materials are solely a silicon oxide.

It is stated that, in the context of the present invention, the trimming is preferably done by grinding. Grinding is a method for removing or thinning that is generally purely mechanical.

Grinding consists of abrading a material by rubbing with grains or cutting particles agglomerated by a binder at least on the surface of a tool. In particular, a diamond wheel rotated on a grinder makes it possible to implement such machining by abrasion.

The grinding may be assisted by a flow of water so as to limit heating of the materials under friction, and/or so as to carry away, by a physical action, particles of abraded material.

The grinding, in the context of the present invention, may be implemented with the addition of free abrasive, or a chemical etching solution.

Hereinafter, the terms "trimming", "grinding" and "machining by abrasion" are synonymous.

Alternatively or in combination, the trimming may also comprise a chemical-mechanical polishing (CMP) method combining chemical and mechanical actions, generally mixing a free abrasive with a wet etching solution.

In the context of the present invention, the etching is preferably done by wet method. It is however possible for substeps, or even all the etching steps, to be able to be implemented by dry method, for example by etchings of the RIE (reactive ion etching) type or plasma etchings (for example ICP—inductively coupled plasma—or CCP—capacitively coupled plasma).

"Selective etching with respect to" or "etching having a selectivity with respect to" means an etching configured to remove a material A or a layer A with respect to a material B or a layer B and having a speed of etching of the material A greater than the speed of etching of the material B. The selectivity is the ratio between the speed of etching of the material A and the speed of etching of the material B.

A film or a layer "based on" a material A, means a film or a layer comprising this material A solely or this material A and optionally other materials, for example alloy elements, impurities or doping elements.

An interface between a layer A and a layer B means an intermediate zone between these two layers A and B. This intermediate zone may be the contact-formation zone, or may comprise a layer C, for example a non-adhesive layer.

In the present patent application, the thickness is taken in a direction perpendicular to the main faces of the layers. On the figures in cross section, the thickness is taken vertically.

The terms "substantially", "approximately", "of" the order of signify the taking into account of the manufacturing and/or measurement tolerances and may in particular correspond to "to within 10%".

The transfer method according to the invention will now be described with reference to the figures accompanying the present application.

As illustrated in FIGS. 3A and 3B, the principle of the invention is preparing specifically before transfer a substrate 1 comprising a layer 11 to be transferred forming a stack 10 with a stop layer 12. This stack 10, also referred to as the end stack or the top stack, is on a bulk layer 30.

The layer to be transferred 11 is referred to as the top layer 11. The stop layer 12 is also referred to as the end stop layer.

The end stack 10 can therefore consist of two layers. It consequently forms a dual layer 10.

According to one possibility, the stack 10 may comprise three layers or more.

The specific preparation of the substrate 1 consists of forming at least one supplementary stack 20 interposed between the end stack 10 and the bulk layer 30.

This supplementary stack 20 preferably comprises two layers 21, 22. It consequently forms a dual layer 20. According to one possibility, the supplementary stack 20 may comprise three layers or more.

This supplementary stack 20 thus forms a buffer zone between the bulk layer 30 and the stop layer 12 of the stack 10.

This buffer zone advantageously improves the control of the etchings intended to remove the stop layer 12 and to preserve the layer 11 to be transferred.

The supplementary stack 20 is therefore a multilayer stop stack.

The substrate 1 may comprise a plurality of dual layers 20 interposed between the layer 30 and the dual layer 10.

The thicknesses of each of the layers in each dual layer 10, 20 preferably decrease from the rear face 101 towards the front face 100.

The thicknesses of each dual layer 10, 20 preferably decrease from the rear face 101 towards the front face 100.

Advantageously, the dual layers 10, 20 are of the same nature and/or chemical composition.

In particular, the dual layer 10 may comprise a layer 11 to be transferred made from a semiconductor material and a stop layer 12 made from a dielectric material, and the dual layer 20 may comprise a layer 21 made from this same semiconductor material and a layer 22 made from this same dielectric material.

This advantageously simplifies the technological steps of the transfer method. This in particular simplifies the steps of forming the dual layers 10, 20, and the steps of etching these dual layers 10, 20.

The layers preferably made from a dielectric material and the layers preferably made from a semiconductor material of two adjacent dual layers 10, 20 are preferably alternating.

The thickness of the dual layer 10 is advantageously strictly less than the thickness of the dual layer 20, preferably by a factor of five, or even a factor of ten.

According to an example illustrated in FIG. 3A, the layer to be transferred 11 is at least two times less thick than the layer 21 of the dual layer 20. The stop layer 12 is at least two times less thick than the layer 22 of the dual layer 20.

According to an example illustrated in FIG. 3B, the layer 21 of the dual layer 20 is at least two times less thick than the layer 22 of the dual layer 20. The layer to be transferred 11 is at least two times less thick than the stop layer 12.

The ratio between the thicknesses of the layer made from a semiconductor material and the layer made from a dielectric material in the dual layer 10, 20 can therefore be substantially equal to 2. This ratio is preferably between 1 and 3.

The embodiments of these examples may be combined. The thicknesses of the various dual layers 10, 20 are advantageously chosen so as to be able to transfer a thin layer to be transferred 11, that is to say having a thickness of less than 200 nm, for example between 20 nm and 50 nm.

For example, the dual layer 10 may have a thickness of between 50 nm and 200 nm, and the dual layer 20 may have a thickness of between 500 nm and 2 µm.

The stop dual layer 20 is thus sufficiently thick to protect the end dual layer 10 during the etching aimed at exposing the layer to be transferred 11.

Such a substrate 1 comprising, between the rear face 101 thereof and the front face 100 thereof, successively a bulk layer 30, the thick stop dual layer 20 and the fine end dual layer 10, advantageously allows progressiveness of the removal and/or etching steps from the rear face 101 towards the front face 100 aimed at exposing the layer to be transferred 11.

The thicknesses of each of the layers of the substrate 1 preferably decrease from the rear face 101 towards the front face 100.

Figure 4:
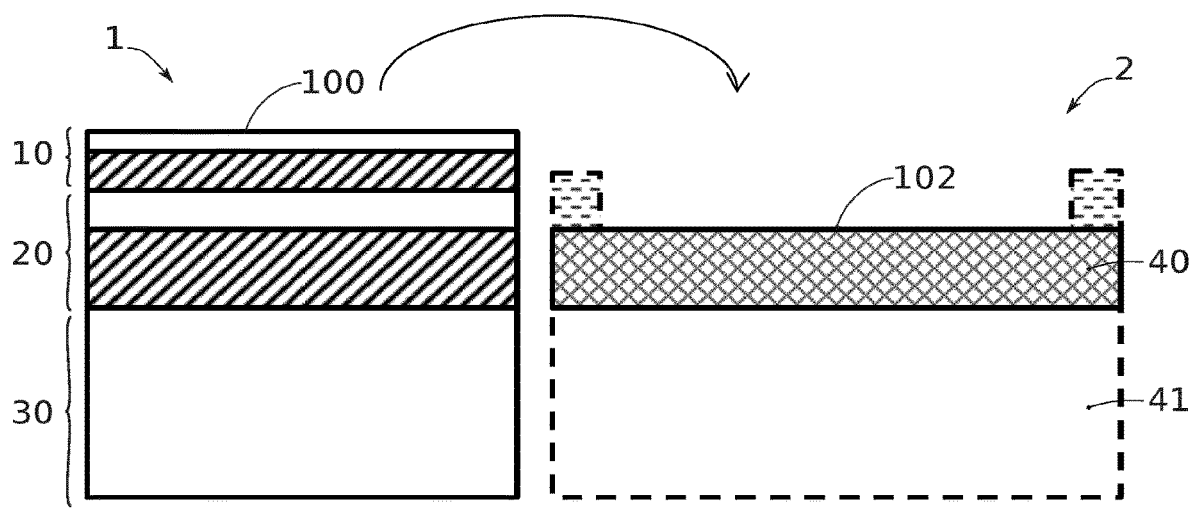
FIGS. 4 to 10B illustrate in cross section steps of the transfer method according to one embodiment of the invention.

With reference to FIGS. 4 to 10, the transfer method according to the invention provides a step of bonding the front face 100 of the substrate 1 to the free face 102 of a layer 40 made from a polymer material, referred to as a polymer layer, of a second substrate (FIG. 4).

Optionally, a non-stick layer may be deposited on the front face 100 of the layer to be transferred 11, before the substrate 1 and the layer 40 respectively are put in contact at the front face 100 and the free face 102.

Figure 5:
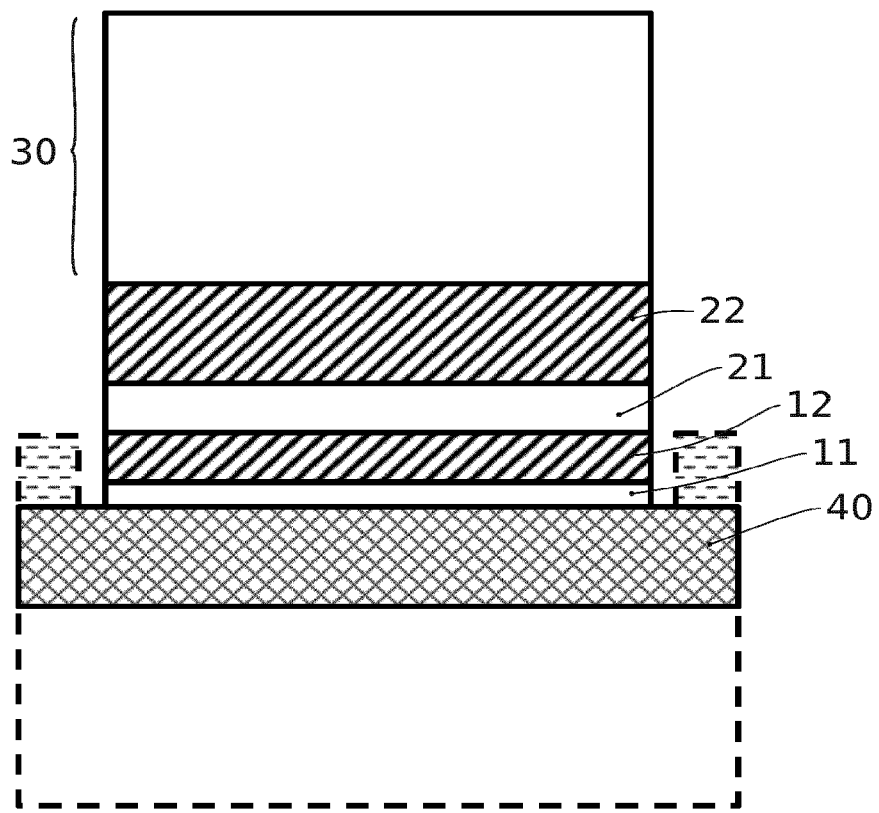

The layer to be transferred 11 is consequently in contact with or in an interface with the polymer layer 40 (FIG. 5).

The following steps of the transfer method consist of successively removing, as from the rear face 101 of the substrate 1, first the bulk layer 30, then the layer 22, then the layer 21, and next the stop layer 12 in order to expose the layer to be transferred 11.

Figure 6:
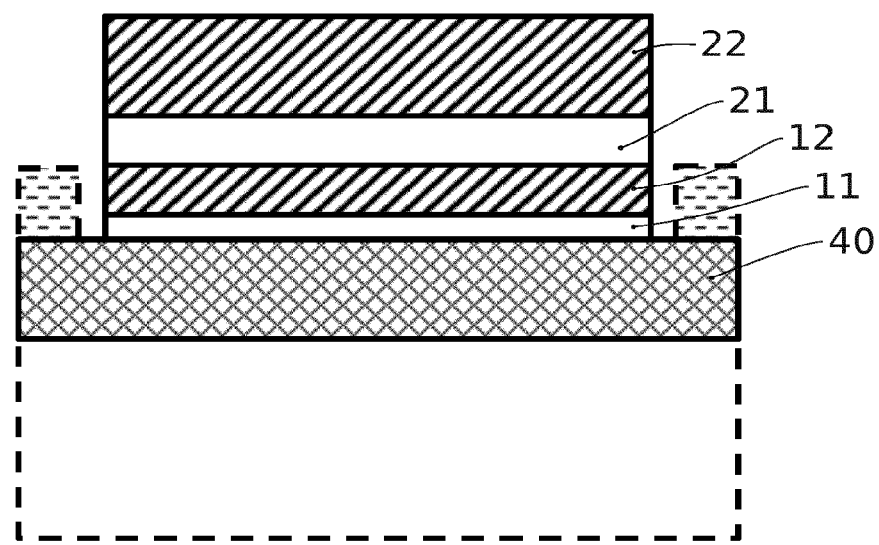

The removal of the bulk layer 30 is mainly done by trimming. Mechanical abrasion makes it possible to remove the major part of the bulk layer 30 quickly, over at least 90% of the thickness thereof. The trimming that may be configured to leave a residual thickness of layer 30 of approximately 25 μm or advantageously 50 μm. Additional etching makes it possible to remove the layer 30 over the entire residual thickness. This additional etching is configured to stop in the layer 22, preferably at the interface between the bulk layer 30 and the layer 22 (FIG. 6). In particular, the selectivity of the additional etching of the material of the bulk layer 30 with respect to the material of the layer 22 is preferably greater than 10, and preferably greater than 100. The bulk layer 30 is thus completely removed.

Figure 7:
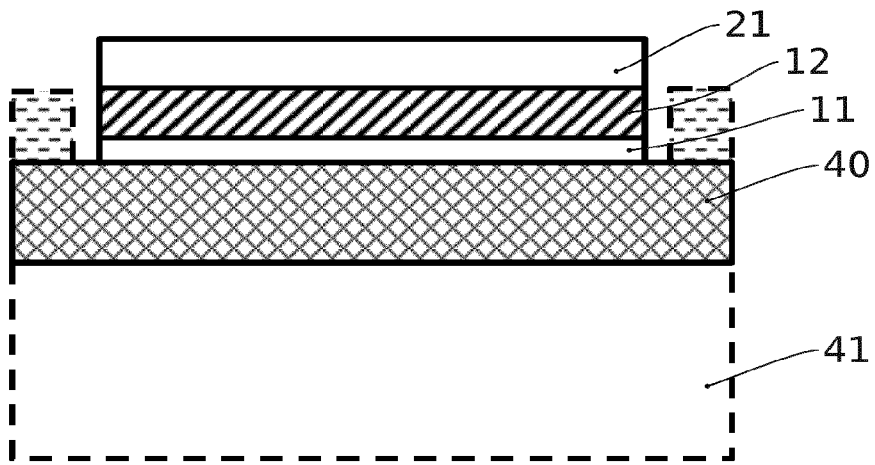

The layer 22 is next removed by a first etching (FIG. 7). This first etching is configured to stop in the layer 21, preferably at the interface between the layer 22 and the layer 21. It has an etching selectivity with respect to the material of the layer 21 that is preferably greater than 10, and preferably greater than 100.

Figure 8:
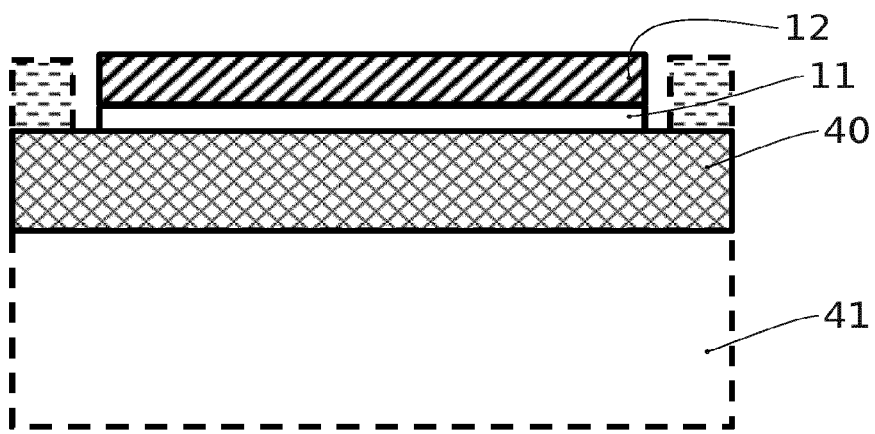

The layer 21 is next removed by a second etching (FIG. 8).

Advantageously, the layer 21 and the bulk layer 30 are composed of the same material.

Consequently the etching solution of the additional etching can once again be used so as to remove the layer 21 by this second etching.

The second etching is configured to stop in the stop layer 12, preferably at the interface between the layer 21 and the stop layer 12. It has an etching selectivity with respect to the material of the stop layer 12 that is preferably greater than 10, and preferably greater than 100.

Figure 9:
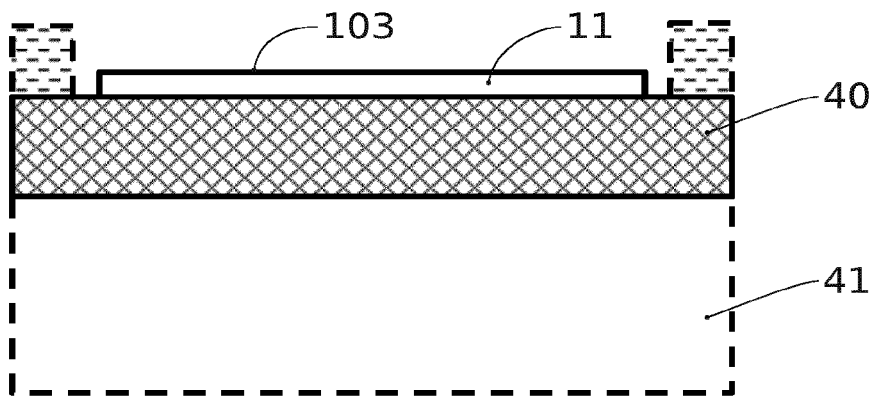

The stop layer 12 is next removed by etching (FIG. 9).

Advantageously, the layer 22 is composed of the same material as the stop layer 12, and the layer 21 is composed of the same material as the layer to be transferred 11.

Consequently, the etching solution of the first etching can once again be used so as to remove the stop layer 12.

This etching of the stop layer 12 is configured to stop substantially at the interface between the stop layer 12 and the layer to be transferred 11. One face 103 of the layer to be transferred 11, opposite to the front face 100, is thus exposed. This face is simply referred to as the "opposite face 103" hereinafter.

The layer to be transferred 11 is thus transferred onto the polymer layer 40 of the second substrate.

Figure 10A:
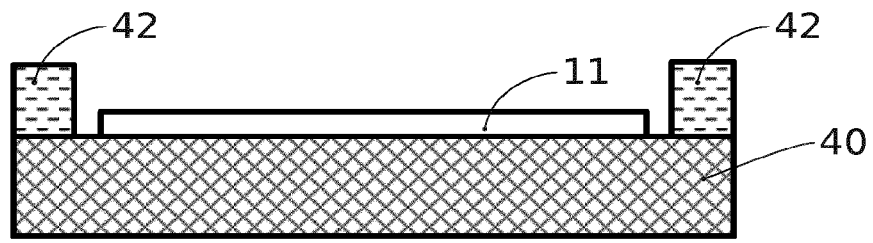
Figure 10B:
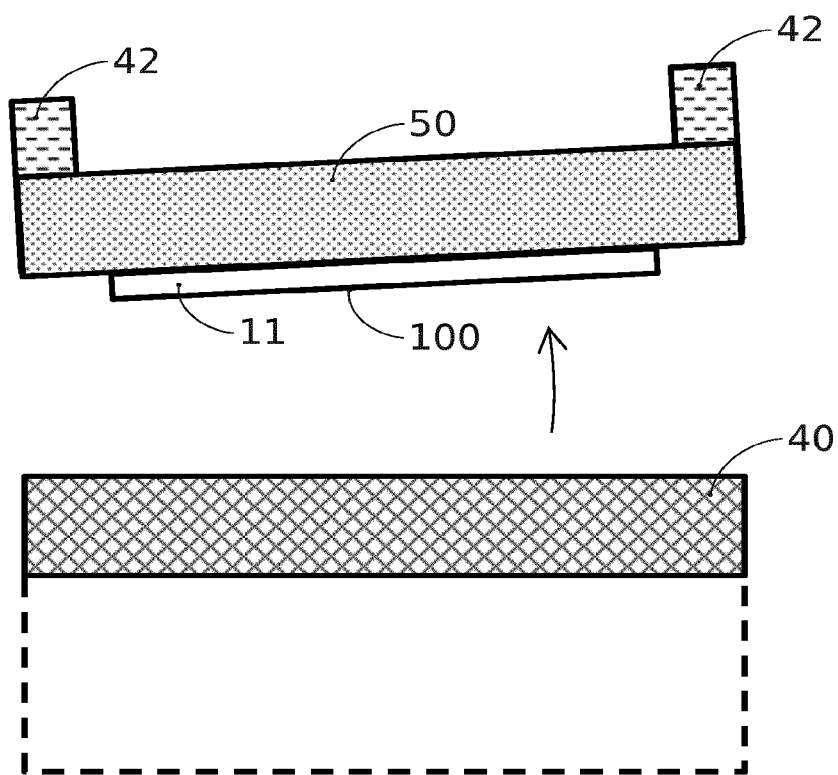

Optionally, the polymer layer 40 surmounted by the top layer 11 can then be separated from the carrier substrate 41 and/or held by a structural ring 42 (FIG. 10A). Alternatively, the exposed face of the top layer 11 can be put into contact with and/or bonded to another flexible substrate 50, and then separated from the polymer layer 40, for example by mechanical pulling away (FIG. 10B). In this last case, the front face 100 of the top layer 11 is once again exposed.

This advantageously makes it possible to obtain a top layer 11 on a flexible substrate 50 having the initial surface state of the front face 100. The surface state of the front face 100, generally obtained by CMP, can be of a quality greater than the surface state of the opposite face 103 obtained by etching the stop layer 12.

The transfer method thus makes it possible to transfer a layer to be transferred 11 onto a polymer layer 40 by means of a gradual and controlled removal of the various layers 30, 22, 21, 12.

Advantageously, the bulk layer 30 is made from a semiconductor material and the dual layers 10, 20 all respectively have a layer 11, 21 made from this same semiconductor material alternating with a layer 12, 22 made from the same dielectric material.

This makes it possible to use only two etching solutions for alternately etching the layers 30, 21 made from semiconductor material and the layers 12, 22 made from dielectric material.

The semiconductor material may be based on silicon or germanium or AlN or AsGa or InP. The dielectric material may be based on silicon oxide or silicon nitride or amorphous carbon or TiN or TaN.

The successive etching steps of this method are thus simplified.

According to one possibility, other etching solutions can be used alternatively or in combination. For example, a third type of etching may be used for etching the finest layers, so as to reduce the etching speed if necessary.

According to a first embodiment, the substrate 1 is preferably of the SOI type (the acronym for "silicon on insulator"; but materials other than silicon are also possible). The methods for obtaining an SOI substrate are known. These methods are generally used for obtaining a dual layer on a bulk substrate. They also make it possible to obtain a second dual layer on a first dual layer. These methods are not the object of the present invention.

The layer to be transferred 11 is made from silicon, also referred to as top Si (signifying top silicon) hereinafter. It preferably has a thickness of between 10 nm and 100 nm, for example around 20 nm.

The stop layer 12 is made from silicon dioxide, also referred to as BOX (the acronym for "buried oxide"). It preferably has a thickness of between 30 nm and 200 nm, for example around 40 nm.

The layer 21 is made from silicon. It preferably has a thickness of between 50 nm and 200 nm, for example around 100 nm.

The layer 22 is made from silicon dioxide. It preferably has a thickness of between 200 nm and 600 nm, for example around 400 nm.

The layer 30 is made from silicon. It typically has a thickness of several hundreds of μm and may also be referred to as bulk Si hereinafter.

This substrate 1 may have a diameter of 200 mm or 300 mm.

The front face 100 of this substrate 1 can be prepared in advance by a surface preparation step.

According to one possibility, the 3M™ Novec™ 2072 non-stick layer is deposited on this front face 100, for example by centrifugation.

This non-stick layer advantageously facilitates subsequent removal of the layer to be transferred 11, in particular removal by mechanical pulling away.

A layer 40 having a thickness of approximately 40 µm of BrewerBOND® 305 polymer is preferably deposited by centrifugation on a silicon wafer 41 in order to form the second substrate 2.

The front face 100 of the substrate 1 and the free face 102 of the second substrate 2 are turned facing each other and put in contact.

The substrates 1, 2 are next bonded at 210° C. under vacuum.

A trimming, or grinding, of the layer 30 of silicon is implemented.

This grinding is configured to quickly remove a major part of the thickness of the layer 30, for example with a removal rate of between 10 µm·min$^{-1}$ and 100 µm·min$^{-1}$.

This grinding step is for example implemented by a grinder of make Okamoto®, model 254B 3W5X J 75BA 325 40SB8, with a diamond wheel having a grain size of 16000/325 µm.

The grinding of the layer 30 can be stopped so as to leave a residual thickness of silicon of approximately 50 µm for example.

The residual thickness of silicon is next removed by wet etching.

A chemical solution based on acetic acid/70% H NO$_3$/49% HF in a 3/3/4 proportion advantageously makes it possible to remove these 50 µm in a few minutes (for example less than 10 minutes, or even less than 5 minutes, and advantageously less than 3 minutes).

Such a solution is more effective than a standard etching solution based on 25% TMAH implemented at a temperature of 80° C. Removing 50 µm of silicon with the standard 25% TMAH etching solution at 80° C. requires approximately 5 hours of attack in immersion. The layer 40 of BrewerBOND® 305 polymer 40 µm thick cannot withstand such a long attack.

The layer 22 of silicon oxide is next removed by wet etching with a typical 50% HF solution.

The thick layer 21 of silicon is next removed by etching in acetic acid/70% HNO$_3$/49% HF solution, immersed for a very short time, for example less than 2 seconds and preferably around one second, so as to stop the etching in the fine stop layer 12 of silicon oxide.

The stop layer 12 (BOX) is next removed by wet etching with a typical solution of 10% HF.

At the end of this etching step, the opposite face 103 of the fine top layer 11 (top Si) of silicon is exposed (FIG. 9).

According to a preferred possibility, a polymer film 50 held by a metal cutout ring 42 is bonded on the opposite face 103 of the top Si 11.

The second substrate 2 is next removed by mechanical pulling away, so as to keep only the top Si 11 on the polymer film 50, with the front face 100 free (FIG. 10B).

Other embodiments of the method according to the invention can be considered. Only the distinct features of the first embodiment are described below, the other features not described being deemed to be identical to those of the first embodiment.

According to a second embodiment, the residual thickness of silicon after trimming of the layer 30, for example around 50 µm, is removed, this can be done by wet etching in particular based on acetic acid/70% HNO$_3$/49% HF in a 3/3/4 proportion as in the first embodiment.

The layer 22 of silicon oxide is next removed by wet etching with a typical solution of 10% HF.

The thick silicon layer 21 is next removed by etching in solution, this time based on 12% TMAH implemented at a temperature of 80° C., for a time of a few minutes, for example less than 10 minutes, or even less than 5 minutes, preferably less than 3 minutes, so as to stop the etching in the fine stop layer 12 of silicon oxide. With such a short time, the polymer 40 withstands the chemical attack.

This etching has an etching speed less than that of etching based on acetic acid/70% HNO$_3$/49% HF in a 3/3/4 proportion. Consequently, the tolerance on the etching time is greater. Implementation of this step is facilitated. Moreover, the selectivity of this etching between the silicon and the silicon oxide $S_{Si/SiO2}$ is greater than 500:1. This advantageously makes it possible to preserve the integrity of the stop layer 12.

The stop layer 12 (BOX) is next removed by wet etching with a typical solution of 10% HF.

At the end of this etching step, the opposite face 103 of the fine top layer 11 (top Si) of silicon is exposed (FIG. 9).

According to a preferred possibility, a polymer film 50 held by a metal cutout ring 42 is bonded on the opposite face 103 of the top Si 11.

The second substrate 2 is next removed by mechanical pulling away, so as to keep only the top Si 11 on the polymer film 50, with the front face 100 free (FIG. 10B).

The invention is not limited to the embodiments described above and extends to all embodiments covered by the claims.

For example, some etching steps may be performed by dry method. The thickest layers of the supplementary stack may be removed by chemical-mechanical method.

The invention claimed is:

1. A method for transferring a layer comprising the following steps:
providing a first substrate having a front face and a rear face and comprising a support forming the rear face and a stack on the support, said stack comprising a first layer made from a first, semiconductor, material, forming the front face, and a second layer made from a second, dielectric, material,
providing a second substrate having a free face and comprising a layer made from a polymer material forming the free face,
bonding the first and second substrates at an interface between the front face of the first substrate and the free face of the second substrate,
removing the support and then the second layer from the first substrate, so as to expose the first layer bonded on the layer made from a polymer material,
and wherein the first substrate is formed with at least one supplementary stack comprising a third layer made from a third material and a fourth layer made from a fourth material, said at least one supplementary stack being interposed between the support and the stack of the first substrate, so that the fourth layer is on the same side as the support and the third layer is on the same side as the second layer of the stack,
the method further comprising:
at least one additional step configured to remove the fourth layer, then the third layer, and then the second layer;

the fourth layer is removed by an etching having a selectivity with regard to the third material greater than 5, then the third layer is removed by an etching having a selectivity with respect to the second material greater than 5, then the second layer is removed by an etching having a selectivity with respect to the first material greater than 5.

2. The method according to claim 1, wherein the thickness of the first layer is selected strictly less than the thickness of the third layer, and wherein the thickness of the second layer is selected strictly less than the thickness of the fourth layer.

3. The method according to claim 1, wherein the thickness of the first layer is selected strictly less than the thickness of the second layer, and wherein the thickness of the third layer is selected strictly less than the thickness of the fourth layer.

4. The method according to claim 1, wherein the thickness of the first layer is selected strictly less than the thickness of the third layer, and wherein the thickness of the second layer is selected strictly less than the thickness of the fourth layer, and wherein the thickness of the first layer is selected strictly less than the thickness of the second layer, and wherein the thickness of the third layer is selected strictly less than the thickness of the fourth layer.

5. The method according to claim 1, wherein the support is partially removed by trimming, said trimming being configured to leave a residual layer of the support having a residual thickness less than or equal to 50 µm.

6. The method according to claim 5, wherein the residual layer is removed by a first etching having a selectivity with respect to the fourth material greater than 5.

7. The method according to the preceding claim 6, wherein the first etching and the etching of the third layer are etchings in a solution having the same composition.

8. The method according to claim 1, wherein the etching of the fourth layer and the etching of the second layer are etchings in a solution having the same composition.

9. The method according to claim 1, wherein the thickness of the second layer is less than or equal to 100 nm.

10. The method according to claim 1, wherein the thickness of the first layer is less than 50 nm.

11. The method according to claim 1, wherein the polymer material is a thermoplastic material and/or the first and third materials are at least one from silicon, germanium and a silicon-germanium alloy, and/or the second and fourth materials are at least one from a silicon oxide and a silicon nitride.

12. The method according to claim 1, wherein the support is made from silicon, the first and third materials are solely silicon and the second and fourth materials are solely a silicon oxide.

\* \* \* \* \*